(12) United States Patent
Cha

(10) Patent No.: US 8,746,027 B2
(45) Date of Patent: Jun. 10, 2014

(54) MULTI-LAYER MOLD COATING

(71) Applicant: Hyundai Motor Company, Seoul (KR)

(72) Inventor: Sung Chul Cha, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 13/661,533

(22) Filed: Oct. 26, 2012

(65) Prior Publication Data

US 2014/0041435 A1 Feb. 13, 2014

(30) Foreign Application Priority Data

Aug. 7, 2012 (KR) .................. 10-2012-0086217

(51) Int. Cl.
*B21D 37/18* (2006.01)

(52) U.S. Cl.
USPC ....... 72/41; 72/47; 72/273; 72/467; 76/107.1; 76/107.4; 164/6; 164/46; 249/114.1; 249/135

(58) Field of Classification Search
USPC .............. 76/107.1, 107.4; 72/41, 46, 47, 273; 72/274, 370.06, 467, 468; 164/6, 46; 249/114.1, 135
See application file for complete search history.

(56) References Cited

U.S. PATENT DOCUMENTS

| | | | | |
|---|---|---|---|---|
| 4,095,449 | A * | 6/1978 | Roach et al. | 72/273 |
| 5,318,091 | A * | 6/1994 | Pavoni et al. | 164/6 |
| 6,497,772 | B1 | 12/2002 | Meckel et al. | |
| 7,587,919 | B1 * | 9/2009 | Young | 72/41 |
| 7,732,066 | B2 * | 6/2010 | Fukui et al. | 428/698 |
| 8,021,768 | B2 | 9/2011 | Ge | |
| 8,507,110 | B2 * | 8/2013 | Ahlgren | 428/697 |

FOREIGN PATENT DOCUMENTS

| | | |
|---|---|---|
| JP | 09217168 A | 8/1997 |
| KR | 10-0512269 | 4/2001 |
| KR | 10-0818165 | 8/2007 |
| KR | 1020070080885 A | 8/2007 |

OTHER PUBLICATIONS

Cha et al. "Studies on the Coating Materials for Forming Dies of Advanced High Strength Steel Sheets," Adv. Funct. Mat. Research team, 2) Sheet Metal Development TFT, Automotive, R&D division, Hyundai Motor Group, 772-1 Jangduk-dong, Hwaseong 445-706, Korea.

* cited by examiner

*Primary Examiner* — David B Jones
(74) *Attorney, Agent, or Firm* — Edwards Wildman Palmer LLP; Peter F. Corless

(57) ABSTRACT

The present disclosure provides a multi-layer tool piece coating. For example, the tool piece may be a mold or die used for forming ultra high strength steel sheet. The multi-layer mold coating may include a CrN or Ti(C)N junction layer, a first TiAlN/CrN nano multilayer, and a second TiAlCN/CrCN nano multilayer. The CrN or Ti(C)N junction layer may be coated on a base material of the tool piece (e.g., a mold) for forming the steel sheet. The first TiAlN/CrN nano multilayer may be coated on the CrN or Ti(C)N junction layer as an intermediate layer. The second TiAlCN/CrCN nano multilayer may be coated on the first TiAlN/CrN nano multilayer as an outermost surface functional layer, and may include carbon (C) of about 1 at. % to about 30 at. % for high temperature and low friction.

11 Claims, 6 Drawing Sheets

0.5-5um
SECOND NANO MULTILAYER 0.5-5um
FIRST NANO MULTILAYER

JUNCTION LAYER

: SURFACE SCRATCH OR LOCAL EXFOLIATION

COMPARATIVE EXAMPLE 1

: SURFACE SCRATCH OR LOCAL EXFOLIATION

COMPARATIVE EXAMPLE 4

EXAMPLE

MULTI-LAYER MOLD COATING

CROSS-REFERENCE TO RELATED APPLICATION

This application claims under 35 U.S.C. §119(a) the benefit of Korean Patent Application No. 10-2012-0086217 filed Aug. 7, 2012, the entire contents of which are incorporated herein by reference.

BACKGROUND (a) Technical Field

The present invention relates to a multi-layer mold coating material for use in forming an ultra-high strength steel sheet. More particularly, the present invention relates to a multi-layer mold coating material for forming an ultra-high strength steel sheet that provides heat resistance, abrasion resistance, and low friction characteristics to the surface of the mold.

(b) Background Art

Steel sheet may be formed by a variety of processes such as, for example, deep drawing, incremental sheet forming, punching, rolling, stamping, etc. These processes typically require a tool piece (e.g., a mold, a die, punch, etc.) in order to form the steel sheet. Such tool pieces are subject to extreme wear during the metal working process. Conventionally, such tool pieces are treated or coated (e.g., by chemical vapor deposition (CVD), physical vapor deposition (PVD), quenching, tempering, diffusion hardening, etc.) so as to increase their longevity for use in the metal forming process.

Conventional art coating materials for a mold for forming a steel sheet for vehicles typically include, for example, Toyota Diffusion (TD), TiAlN, and AlTiCrN+MoS2. These coating materials are frequently used for molds used to form steel sheet with a tensile strength of 800 MPa or less, and provide a tool piece (e.g., mold/die) lifespan of about 70,000 press strokes.

Recent trends for steel sheet development are toward high strength/light weight thin-wall steel (e.g., for vehicle safety applications). Consequently, typical mold coating materials are deficient in durability and abrasion resistance when used to form steel sheets with a tensile strength of 980 MPa or more. In other words, a major disadvantage of conventional coating materials is that they provide a tool piece lifespan of only about 50,000 press strokes or less, after which the coating layer is exfoliated from the surface of the tool piece (e.g., the mold). For example, a mold with a typical TD coating layer has a lifespan of only about 30,000 strokes while manually modifying a deformation upon heat treatment.

Another disadvantage of conventional coating materials is that many require the use of a lubricant during the steel sheet forming process. For example, coating materials such as TiAlN and Al TiCrN+MoS2 typically require the use of a drawing oil due to deficiency of durability of the coated tool piece. While the use of a lubricant allows friction and abrasion to be temporarily reduced, the drawing oil may introduce impurities into the steel sheet that may negatively affect a subsequent process, e.g., a welding process, causing a reduction in the quality of the molded products.

Accordingly, there is a need for tool piece coating materials with abrasion resistance, heat resistance, fatigue resistance, high lubrication, and low friction characteristics, for molding steel sheet with a tensile strength of 980 MPa or more.

SUMMARY OF THE DISCLOSURE

The present invention provides a multi-layer mold for use in forming ultra-high strength steel. According to the techniques described herein, a multi-layer mold may be formed by coating the surface of the mold with CrN or Ti(C)N, a TiAlN/CrN nano multilayer, and a TiAlCN/CrCN nano multilayer, which may provide heat resistance, oxidation resistance, abrasion resistance, and low friction characteristics to the tool piece (e.g., a mold), and also greatly extend the lifespan of the mold.

In one aspect, the present invention provides a multi-layer mold comprising: a CrN or Ti(C)N junction layer coated on a base material of the mold; a first TiAlN/CrN nano multi-layer coated on the CrN or Ti(C)N junction layer as an intermediate layer; and a second TiAlCN/CrCN nano multi-layer coated on the first TiAlN/CrN nano multi-layer as an outermost surface layer including carbon (C) of about 1 at.% to about 30 at. % for high temperature and low friction.

In an exemplary embodiment, the CrN or Ti(C)N junction layer, and the first TiAlN/CrN nano multi-layer and the second TiAlCN/CrCN nano multilayer may be coated in a thickness of about 0.5 μm to about 5 μm.

In another exemplary embodiment, the first TiAlN/CrN nano multi-layer may include TiAlN and CrN alternately coated on each other to form a multi-layer.

In still another exemplary embodiment, the second TiAlCN/CrCN nano multi-layer may include TiAlCN and CrCN alternately coated on each other to form a multi-layer.

In yet another exemplary embodiment, the CrN or Ti(C)N junction layer, and the first TiAlN/CrN nano multi-layer and the second TiAlCN/CrCN nano multi-layer may be coated by a method selected from the group consisting of PVD, PACVD, HIPIMS, and ICP methods.

Other aspects and exemplary embodiments of the invention are discussed infra.

BRIEF DESCRIPTION OF THE DRAWINGS

The above and other features of the present invention will now be described in detail with reference to certain exemplary embodiments thereof illustrated in the accompanying drawings, which are given hereinbelow by way of illustration only, and thus are not limitative of the present invention, and wherein.

Figure 1:
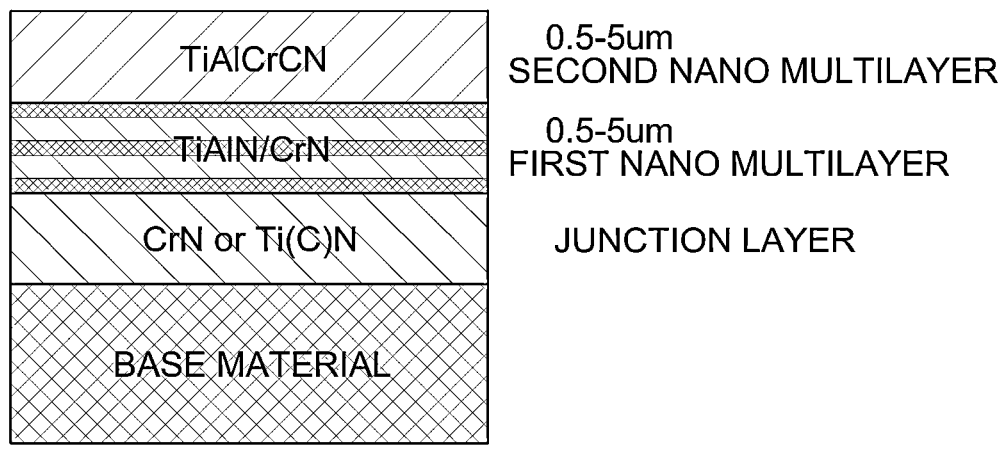
FIG. 1 is a cross-sectional view illustrating an exemplary multi-layer mold coating according to an embodiment of the present invention.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment. In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that the present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Ranges provided herein are understood to be shorthand for all of the values within the range. For example, a range of 1 to 50 is understood to include any number, combination of numbers, or sub-range from the group consisting of 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50, as well as all intervening decimal values between the aforementioned integers such as, for example, 1.1, 1.2, 1.3, 1.4, 1.5, 1.6, 1.7, 1.8, and 1.9. With respect to sub-ranges, "nested sub-ranges" that extend from either end point of the range are specifically contemplated. For example, a nested sub-range of an exemplary range of 1 to 50 may comprise 1 to 10, 1 to 20, 1 to 30, and 1 to 40 in one direction, or 50 to 40, 50 to 30, 50 to 20, and 50 to 10 in the other direction.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

The present invention is based, at least in part, on the discovery that the lifespan of a steel sheet tool piece (e.g., a mold, die, etc.) may be extended, and the quality of an ultra-high strength steel plate produced by the tool piece may be improved, by coating the tool piece with a CrN or Ti(C)N junction layer, a first TiAlN/CrN nano multi-layer, and a second TiAlCN/CrCN nano multi-layer that is the outermost surface, by a Physical Vapor Deposition (PVD) method.

Specifically, the multi-coating layer of the mold according to an exemplary embodiment of the present invention may include the CrN or Ti(C)N junction layer coated in a thickness of about 0.5 µm to about 5 µm, the first TiAlN/CrN nano multi-layer coated in a thickness of 0.5 µm to about 5 µm as an intermediate support layer on the CrN or Ti(C)N junction layer, and the second TiAlCN/CrCN nano multi-layer coated in a thickness of about 0.5 µm to about 5 µm as the outermost surface functional layer on the first TiAlN/CrN nano multi-layer. Hereinafter, each layer will be separately described as follows.

CrN or Ti(C)N Junction Layer

The CrN or Ti(C)N junction layer may have an excellent bonding strength with the base material, and may serve to reduce and control the residual stress of other coating layers. Also, the CrN or Ti(C)N junction layer may be coated on the base material in a thickness of about 0.5 µm to about 5 µm so as to have desirable characteristics such as toughness, fatigue resistance, and shock resistance.

First TiAlN/CrN Nano Multilayer

The first TiAlN/CrN nano multi-layer may include heat-resistance elements (e.g., TiAl and Cr) to provide excellent heat resistance. Also, TiAlN and CrN may be alternately coated in a multi-layer on the CrN or Ti(C)N junction layer to provide oxidation resistance and excellent toughness. The TiAlN and CrN nano layers may be alternately coated to form a total thickness of about 0.5 µm to about 5 µm.

Second TiAlCN/CrCN Nano Multilayer

The second TiAlCN/CrCN nano multi-layer may further include carbon (C) of about 1 at. % to about 30 at. % with excellent low friction characteristics in addition to the components constituting the first TiAlN/CrN nano multi-layer, and may serve as the outermost surface layer. TiAlCN and CrCN may be alternately coated to form a multi-layer. The TiAlCN and CrCN nano layers may be alternately coated to form a total thickness of about 0.5 µm to about 5 µm.

Hereinafter, an exemplary method of coating a multi-coating layer according to an embodiment of the present invention will be described as follows.

The multi-layer coating may be formed by a Physical Vapor Deposition (PVD) method. In addition, High Power Impulse Magnetron Sputtering (HIPIMS), Inductively Coupled Plasma (ICP) Magnetron Sputtering, and arch methods for generating high density plasma to implement nano-sizing of coating material particles and high speed coating may also be used.

Figure 4:
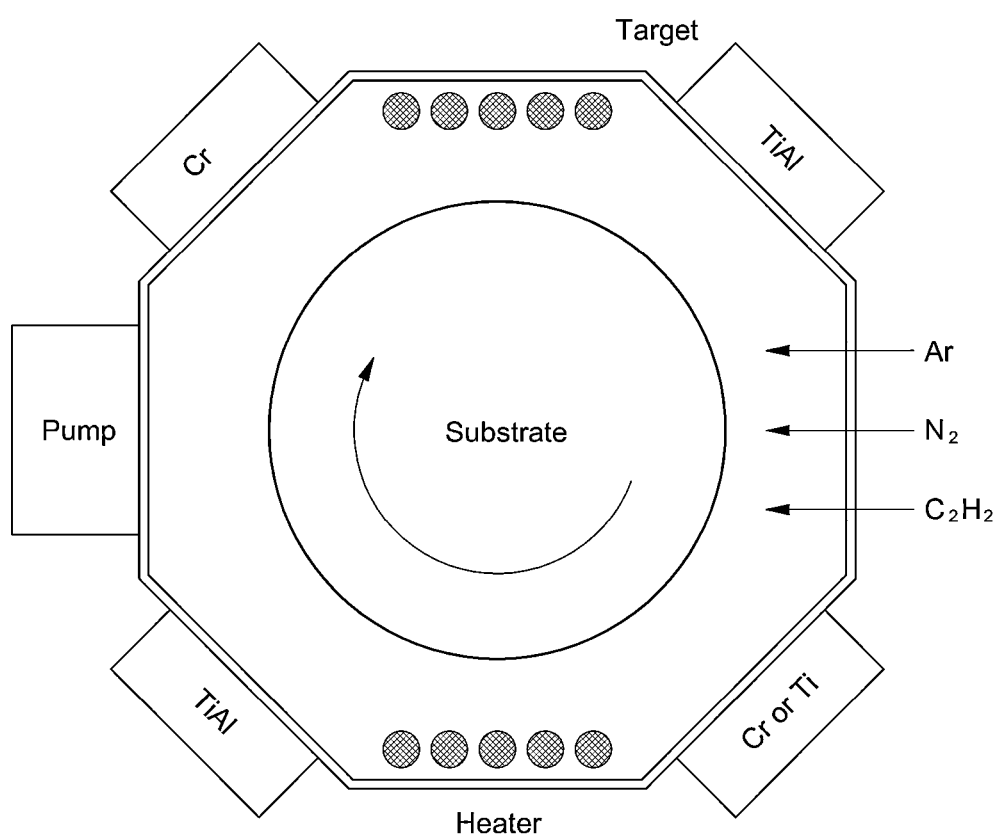
FIG. 4 is a view illustrating a Physical Vapor Deposition (PVD) apparatus for forming a multi-layer mold coating according to an embodiment of the present invention.

FIG. 4 illustrates a PVD coating apparatus. The PVD coating apparatus may include a pair of Ti or Cr targets opposite to each other, a pair of TiAl targets opposite to each other, and a gas supply unit for supplying Ar, $N_2$ and hydrocarbon ($C_xH_y$) process gases.

For a coating process using the PVD coating apparatus, in a vacuum state prior to coating, a plasma state may be prepared using Ar gas. Thereafter, a coating chamber may be heated to a temperature of about 80° C. to activate the surface of the mold base material, and then the surface of the mold base material may be cleaned by applying a bias while allowing Ar ions to collide with the surface of the mold base material (e.g., baking and cleaning).

Next, in order to provide excellent bonding strength with the base material and reduce the residual stress of coating, a CrN or Ti(C)N junction layer may be coated on the base material surface in a thickness of about 0.5 µm to about 5 µm.

A first TiAlN/CrN nano multilayer for providing heat resistance, oxidation resistance, abrasion resistance, and toughness may then be coated on the TiN or TiCN layer by allowing the process gas N2 to flow in the coating chamber. The TiAlN nano layer and the CrN nano layer may be alternately coated in a thickness of about 10 nm to about 50 nm by reacting TiAl ions and Cr ions from the TiAl and Cr targets. Here, the whole thickness of the first TiAlN/CrN nano multilayer may range from about 0.5 µm to about 5 µm. The ratio of Ti:Al:Cr may be 1:1:1.

Thereafter, a second TiAlCN/CrCN nano multilayer for implementing low friction, heat resistance, oxidation resistance, and abrasion resistance may be coated. The second TiAlCN/CrCN nano multilayer may include a TiAlCN nano layer and a CrCN nano layer that are alternately coated in a thickness of about 10 nm to about 50 nm using the TiAl target, the Cr target, and the process gases $C_2H_2$ and $N_2$.

Hereinafter, an exemplary embodiment of the present invention will be described in more detail.

EXAMPLE

Figure 2:
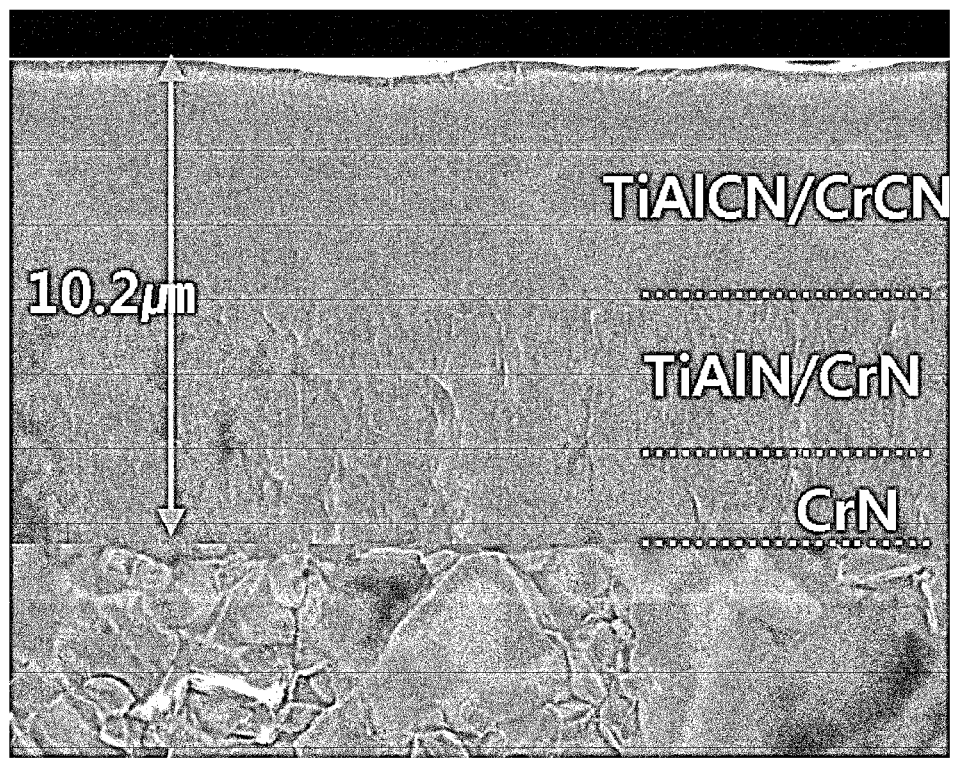
FIG. 2 is an electron microscopic photograph illustrating a texture of an exemplary multi-layer mold coating according to an embodiment of the present invention.

As shown in Table 1 below, a CrN junction layer may be coated on the surface of a mold base material in a thickness of about 4.9 µm by the above described PVD method, and then a first TiAlCrN nano multilayer may be coated on the CrN junction layer in a thickness of about 4.2 µm. Thereafter, a second TiAlCrCN nano multilayer may be coated as the uppermost surface layer in a thickness of about 1.1 µm. The resulting coating texture is shown in FIG. 2.

TABLE 1

|  | Comp. Ex. 1 | Comp. Ex. 2 | Comp. Ex. 3 |
|---|---|---|---|
| Surface treatment/Coating | VC | TiAlN | AlCrN |
| Method | TD | PVD | PVD |
| Thickness (μm) | 8.4 | 9.5 (5CrN—4.5TiAlN) | 9.8 (5CrN—4.8AlCrN) |

|  | Comp. Ex. 4 | Embodiment |
|---|---|---|
| Surfacetreatment/Coating | AlTiCrN4 + MoS2 | TiAlCrCN |
| Method | PVD(+Spraying) | PVD |
| Thickness (μm) | 9.5 (4.9CrN—4.6AlTiCrN) + 20 μm MoS2 | 10.2 (4.9CrN/4.2TiAlCrN—1.1TiAlCrCN) |

Comparative Examples 1 to 4

As shown in Table 1, in comparative example 1, a nitride layer was formed on a base material in a thickness of 8.4 μm by the TD method. In comparative example 2, a CrN layer having a thickness of about 5 μm and a TiAlN layer having a thickness of about 4.5 μm were formed on the surface of the base material by the PVD method. In comparative example 3, a CrN layer having a thickness of about 5 μm and an AlCrN layer having a thickness of about 4.8 μm were formed by the PVD method. Also, in comparative example 4, a coating layer [(4.9CrN-4.6AlTiCrN)+20 um MoS2] was formed in a thickness of about 9.5 μm.

Test Example

Test samples according to the example and the comparative examples 1 to 4 were attached to the upper mold of the mold and blank holder, and then were treated by blank molding for an ultra-high strength steel sheet (e.g., 980 MPa) under the following molding conditions.

Molding condition: 250 ton pressing, cushion pressure: 5 kgf/cm2, rpm 22 to 23, and 10,000 strokes.

Molding blank: 350×296×1 mm

The bonding strength, the hardness, the frictional coefficient, the oxidation temperature, and the abrasion thickness were measured by standard equipment, and the results are shown in Table 2.

As shown in Table 2, the frictional coefficient, the abrasion resistance, and the oxidation resistance of the multi-coating layer according to the exemplary embodiment is better than those of the comparative examples, and so are the bonding strength and the hardness.

Figure 3A:
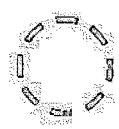
FIGS. 3A-3C are photographs illustrating surfaces of an exemplary multi-layer mold coating according to an embodiment of the present invention, and a coating layer according to comparative examples.
Figure 3A:
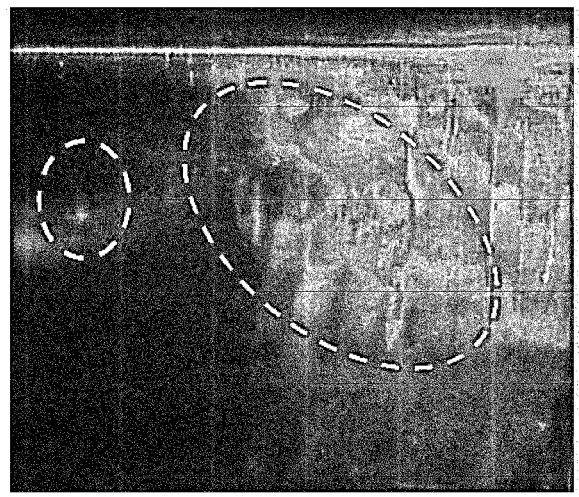
Figure 3B:
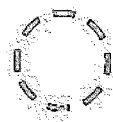
Figure 3B:
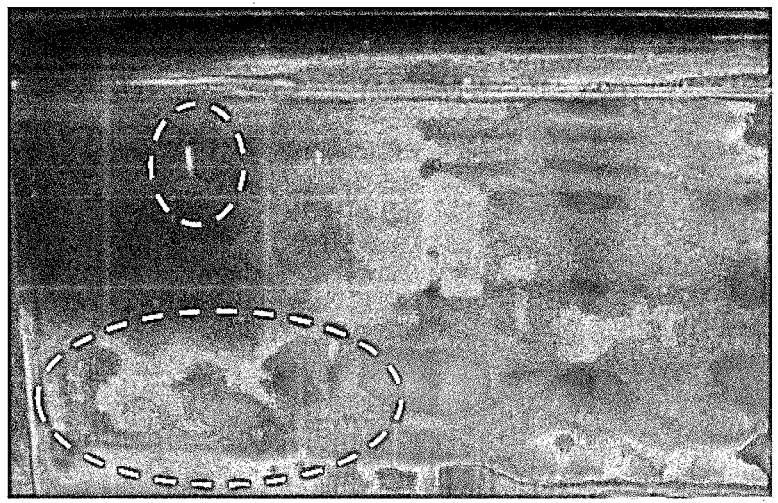
Figure 3C:

Also, after 10,000 strokes of a 250 ton press, the exterior of a test sample was examined with the naked eye. As shown in FIGS. 3A-3C, surface scratch and local exfoliation phenomena occurred in comparative examples 1 (FIG. 3A) and 4 (FIG. 3B), whereas surface scratching was not observed in the tool piece prepared according the techniques described herein, as shown in FIG. 3C.

According to an exemplary embodiment of the present invention, a mold for forming an ultra-high strength steel plate may include a CrN or Ti(C)N junction layer having excellent bonding strength with a base material, reducing coating residual stress, and taking charge of toughness, fatigue resistance, and shock resistance, a first TiAlN/CrN nano multi-layer providing heat resistance, oxidation resistance, abrasion resistance, and toughness as an intermediate layer, and a second TiAlCN/CrCN nano multi-layer further including carbon (about 1 at. % to about 30 at. %) for dealing with high temperature and providing low friction as the uppermost surface layer, thus providing shock resistance and the toughness. Accordingly, the lifespan of the mold for forming the ultra-high strength steel plate may be extended, and the maintenance cost for the mold may be significantly reduced. Also, the quality of the molded products may be improved.

The invention has been described in detail with reference to exemplary embodiments thereof. However, it will be appreciated by those skilled in the art that changes may be made in these embodiments without departing from the principles and

TABLE 2

|  | Comp. Ex. 1 | Comp. Ex. 2 | Comp. Ex. 3 | Comp. Ex. 4 | Ex. |
|---|---|---|---|---|---|
| Bonding strength (N) | 31 | 49.2 | 48.3 | 43 | 51 |
| Hardness (HV) | 2634 | 3179 | 3252 | 3150 | 3367 |
| Frictional Coefficient | 0.571 | 0.562 | 0.621 | 0.523 (0.12 in the initial stage) | 0.354 |
| Oxidation Temp (° C.) | 500 | 810 | 850 | 820 (450) | 890 |
| Abraded thickness (μm) | 0.2 | 0.63 | 0.3 | 0.21 (1.6) | 0.12 |

What is claimed is:

1. A multi-layer mold, comprising:
a junction layer;
a first nano multi-layer; and
a second nano multi-layer,
wherein the junction layer is coated on a base material for the mold, and the first nano multi-layer is sandwiched between the junction layer and the second nano multi-layer, wherein the second nano multi-layer is a TiAlCN/CrCN nano multi-layer and comprises carbon (C) ranging from 1 at. % to 30 at. %.

2. The multi-layer mold of claim 1, wherein the junction layer is CrN or Ti(C)N.

3. The multi-layer mold of claim 2, wherein the CrN or Ti(C)N junction layer has a thickness ranging from 0.5 μm to 5 μm.

4. The multi-layer mold of claim 1, wherein the first nano multi-layer is a TiAlN/CrN nano multi-layer.

5. The multi-layer mold of claim 4, wherein the first TiAlN/CrN nano multi-layer has a thickness ranging from 0.5 μm to 5 μm.

6. The multi-layer mold of claim 1, wherein the second TiAlCN/CrCN nano multi-layer has a thickness ranging from 0.5 μm to 5 μm.

7. The multi-layer mold of claim 1, wherein the first nano multi-layer comprises alternating coatings of TiAlN and CrN.

8. The multi-layer mold of claim 7, wherein each alternating layer has a thickness ranging from 10 nm to 50 nm.

9. The multi-layer mold of claim 1, wherein the second nano multilayer comprises alternating coatings of TiAlCN and CrCN.

10. The multi-layer mold of claim 9, wherein each alternating layer has a thickness ranging from 10 nm to 50 nm.

11. The multi-layer mold of claim 1, wherein the junction layer, the first nano multilayer, and the second nano multi-layer are coated by a process selected from the group consisting of PVD, PACVD, HIPIMS, and ICP.

* * * * *